United States Patent
Lin et al.

(10) Patent No.: US 10,923,466 B2
(45) Date of Patent: Feb. 16, 2021

(54) VERTICAL TRANSIENT VOLTAGE SUPPRESSION DEVICE

(71) Applicant: AMAZING MICROELECTRONIC CORP., New Taipei (TW)

(72) Inventors: Kun-Hsien Lin, Hsinchu (TW); Chih-Wei Chen, Taoyuan (TW); Mei-Lian Fan, Hukou Township (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 331 days.

(21) Appl. No.: 16/043,647

(22) Filed: Jul. 24, 2018

(65) Prior Publication Data
US 2020/0035664 A1 Jan. 30, 2020

(51) Int. Cl.
*H01L 27/02* (2006.01)
*H01L 29/861* (2006.01)

(52) U.S. Cl.
CPC ...... *H01L 27/0255* (2013.01); *H01L 27/0262* (2013.01); *H01L 29/861* (2013.01)

(58) Field of Classification Search
CPC .............. H01L 27/027; H01L 27/0255; H01L 27/0259; H01L 27/0684; H01L 27/0886
See application file for complete search history.

(56) References Cited

U.S. PATENT DOCUMENTS

| | | |
|---|---|---|
| 7,541,648 B2 | 6/2009 | Jin |
| 8,552,530 B2 | 10/2013 | Lin |
| 9,245,755 B2 | 1/2016 | Hornung |
| 9,666,700 B2 | 5/2017 | Hebert |
| 2008/0188047 A1 | 8/2008 | Kim |
| 2009/0032838 A1 | 2/2009 | Tseng |
| 2009/0045457 A1 | 2/2009 | Bobde |
| 2009/0050970 A1 | 2/2009 | Schneider |
| 2012/0025350 A1* | 2/2012 | Lin ............... H01L 27/0259 257/546 |
| 2015/0108536 A1 | 4/2015 | Pan et al. |
| 2016/0300833 A1 | 10/2016 | Guan et al. |

FOREIGN PATENT DOCUMENTS

| | | |
|---|---|---|
| CN | 1901192 A | 1/2007 |
| CN | 107731811 A | 2/2018 |

OTHER PUBLICATIONS

Examination Report issued in corresponding China (PRC) Application No. 201811003147.0 dated May 7, 2020.
Examination Report received in corresponding Taiwan (ROC) Application No. 108124364 dated Jul. 27, 2020.

* cited by examiner

*Primary Examiner* — Cuong Q Nguyen
(74) *Attorney, Agent, or Firm* — Muncy, Geissler, Olds & Lowe, P.C.

(57) ABSTRACT

A vertical transient voltage suppression device includes a semiconductor substrate having a first conductivity type, a first doped well having a second conductivity type, a first heavily-doped area having the first conductivity type, a second heavily-doped area having the first conductivity type, and a diode. The first doped well is arranged in the semiconductor substrate and spaced from the bottom of the semiconductor substrate, and the first doped well is floating. The first heavily-doped area is arranged in the first doped well. The second heavily-doped area is arranged in the semiconductor substrate. The diode is arranged in the semiconductor substrate and electrically connected to the second heavily-doped area through a conductive trace.

16 Claims, 11 Drawing Sheets

VERTICAL TRANSIENT VOLTAGE SUPPRESSION DEVICE

BACKGROUND OF THE INVENTION

Field of the Invention

The present invention relates to a suppression device, particularly to a vertical transient voltage suppression device.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages. The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10.

In U.S. Pat. No. 8,552,530, a vertical transient voltage suppressor is disclosed. The vertical transient voltage suppressor includes an N-type heavily-doped substrate, a P-type lightly-doped region, an N-type heavily-doped deep well, a P-type heavily doped area, a first N-type heavily-doped area, and a second N-type heavily-doped area, as shown in FIG. 3a. The P-type lightly-doped region and the N-type heavily-doped deep well are formed on the N-type heavily-doped substrate. The P-type heavily doped area, the first N-type heavily-doped area, and the second N-type heavily-doped area are formed in the P-type lightly-doped region. The second N-type heavily-doped area is coupled to a first pin. The first pin is coupled to a circuit terminal to be protected. The N-type heavily-doped substrate is coupled to a second pin. The second pin is coupled to a ground terminal. The N-type heavily-doped deep well is coupled to the P-type heavily doped area and the first N-type heavily-doped area. In other words, the P-type lightly-doped region is grounded. The second N-type heavily-doped area, the P-type lightly-doped region, and the N-type heavily-doped substrate form an NPN bipolar junction transistor (BJT). Since the base of the NPN BJT is grounded to limit the gain of the NPN BJT, and the P-type heavily doped area and the second N-type heavily-doped area form a Zener diode, the clamping voltage and the ESD performance of the vertical transient voltage suppressor are respectively higher and worst.

To overcome the abovementioned problems, the present invention provides a vertical transient voltage suppression device, so as to solve the afore-mentioned problems of the prior art.

SUMMARY OF THE INVENTION

A primary objective of the present invention is to provide a vertical transient voltage suppression device, which floats the base of a vertical bipolar junction transistor (BJT) to maintain a low holding voltage and a low clamping voltage and enhance the electrostatic discharge (ESD) performance.

To achieve the abovementioned objectives, the present invention provides a vertical transient voltage suppression device, which comprises a semiconductor substrate having a first conductivity type, a first doped well having a second conductivity type, a first heavily-doped area having the first conductivity type, a second heavily-doped area having the first conductivity type, and a diode. The first doped well is arranged in the semiconductor substrate and spaced from the bottom of the semiconductor substrate, and the first doped well is floating. The first heavily-doped area is arranged in the first doped well. The second heavily-doped area is arranged in the semiconductor substrate. The diode is arranged in the semiconductor substrate and electrically connected to the second heavily-doped area through a conductive trace.

In an embodiment of the present invention, the diode further comprises a second doped well having the second conductivity type, a third heavily-doped area having the second conductivity type, and a fourth heavily-doped area having the first conductivity type. The second doped well is arranged in the semiconductor substrate. The third heavily-doped area is arranged in the second doped well and electrically connected to the second heavily-doped area through the conductive trace. The fourth heavily-doped area is arranged in the second doped well.

In an embodiment of the present invention, the diode further comprises a second doped well having the second conductivity type, a third heavily-doped area having the second conductivity type, and a fourth heavily-doped area having the first conductivity type. The second doped well is arranged in the semiconductor substrate. The third heavily-doped area is arranged in the second doped well. The fourth heavily-doped area is arranged in the second doped well and electrically connected to the second heavily-doped area through the conductive trace.

In an embodiment of the present invention, the vertical transient voltage suppression device further comprises a heavily-doped well having the first conductivity type, the heavily-doped well is arranged in the semiconductor substrate, and the second heavily-doped area is arranged in the heavily-doped well.

The present invention also provides a vertical transient voltage suppression device, which comprises a semiconductor substrate having a first conductivity type, an epitaxial layer, a first doped well having a second conductivity type, a first heavily-doped area having the first conductivity type, a second heavily-doped area having the first conductivity type, and a diode. The epitaxial layer is arranged on the semiconductor substrate. The first doped well is arranged in the epitaxial layer, and the first doped well is floating. The first heavily-doped area is arranged in the first doped well. The second heavily-doped area is arranged in the epitaxial layer. The diode is arranged in the epitaxial layer and electrically connected to the second heavily-doped area through a conductive trace.

In an embodiment of the present invention, the diode further comprises a second doped well having the second conductivity type, a third heavily-doped area having the second conductivity type, and a fourth heavily-doped area having the first conductivity type. The second doped well is arranged in the epitaxial layer. The third heavily-doped area is arranged in the second doped well and electrically connected to the second heavily-doped area through the conductive trace. The fourth heavily-doped area is arranged in the second doped well.

In an embodiment of the present invention, the diode further comprises a second doped well having the second conductivity type, a third heavily-doped area having the second conductivity type, and a fourth heavily-doped area having the first conductivity type. The second doped well is arranged in the epitaxial layer. The third heavily-doped area is arranged in the second doped well. The fourth heavily-doped area is arranged in the second doped well and electrically connected to the second heavily-doped area through the conductive trace.

In an embodiment of the present invention, the vertical transient voltage suppression device further comprises a heavily-doped well having the first conductivity type, the heavily-doped well is arranged in the epitaxial layer to contact the semiconductor substrate, and the second heavily-doped area is arranged in the heavily-doped well.

Below, the embodiments are described in detail in cooperation with the drawings to make easily understood the technical contents, characteristics and accomplishments of the present invention.

DETAILED DESCRIPTION OF THE INVENTION

Figure 1:
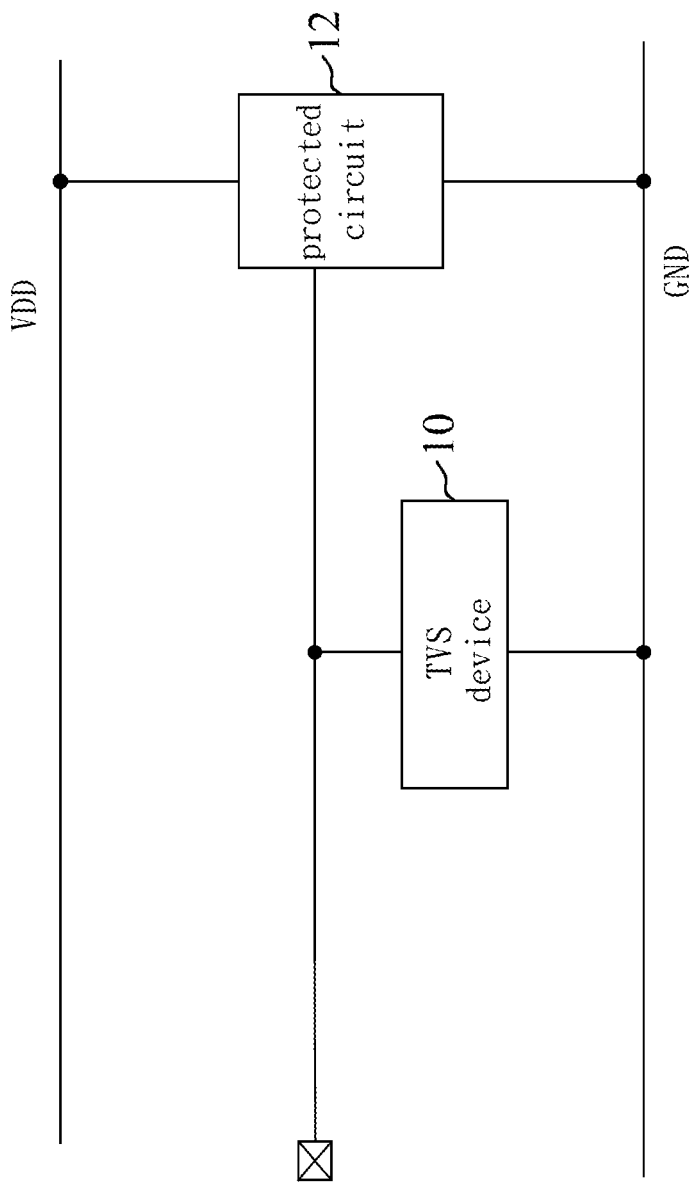
FIG. 1 is a schematic diagram illustrating a transient voltage suppressor (TVS) connected with a protected circuit in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 2:
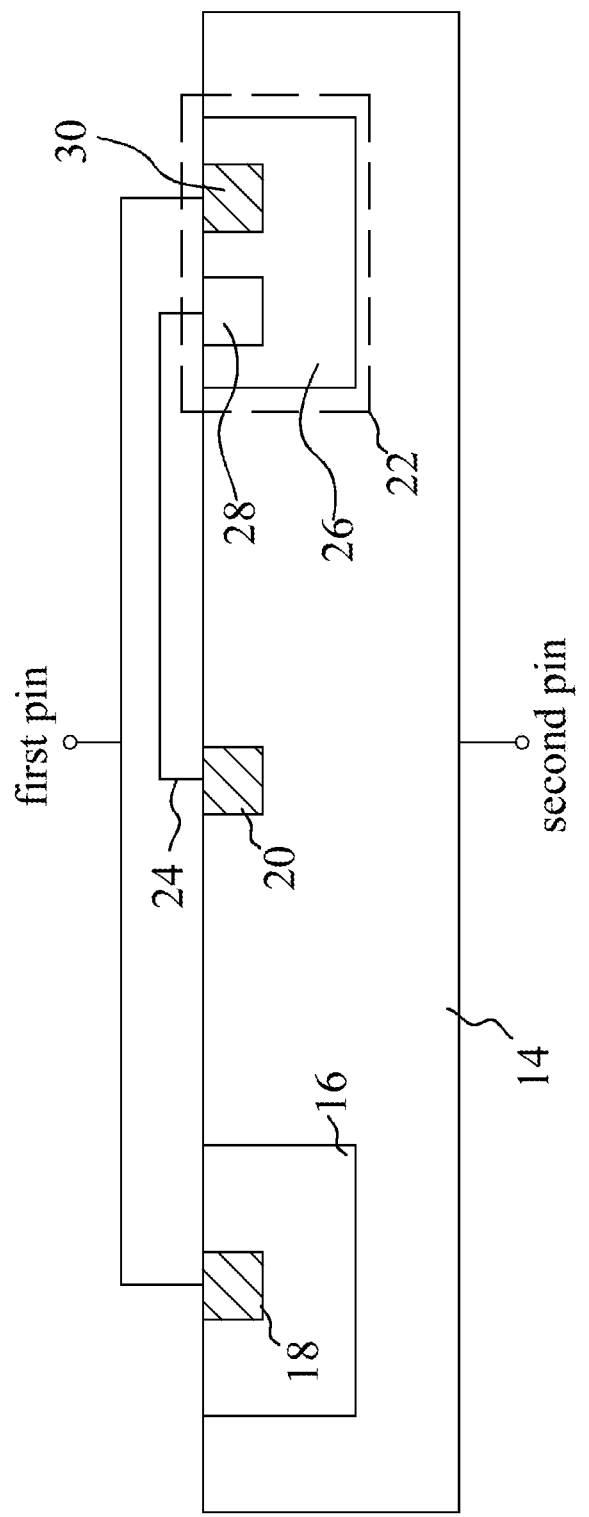
FIG. 2 is a cross-sectional view of a vertical transient voltage suppression device according to the first embodiment of the present invention.

Refer to FIG. 2. The first embodiment of a vertical transient voltage suppression device of the present invention is introduced as follows. The vertical transient voltage suppression device comprises a semiconductor substrate 14 having a first conductivity type, a first doped well 16 having a second conductivity type, a first heavily-doped area 18 having the first conductivity type, a second heavily-doped area 20 having the first conductivity type, and a diode 22. The first doped well 16 is arranged in the semiconductor substrate 14 and spaced from the bottom of the semiconductor substrate 14, and the first doped well 16 is floating. The first heavily-doped area 18 is arranged in the first doped well 16. The second heavily-doped area 20 is arranged in the semiconductor substrate 14. The diode 22 is arranged in the semiconductor substrate 14 and electrically connected to the second heavily-doped area 20 through a conductive trace 24.

The diode 22 further comprises a second doped well 26 having the second conductivity type, a third heavily-doped area 28 having the second conductivity type, and a fourth heavily-doped area 30 having the first conductivity type. The second doped well 26 is arranged in the semiconductor substrate 14. The third heavily-doped area 28 is arranged in the second doped well 26 and electrically connected to the second heavily-doped area 20 through the conductive trace 24. The fourth heavily-doped area 30 is arranged in the second doped well 26. The first heavily-doped area 18 and the fourth heavily-doped area 30 are electrically connected to a first pin and the semiconductor substrate 14 is electrically connected to a second pin.

Figure 3:
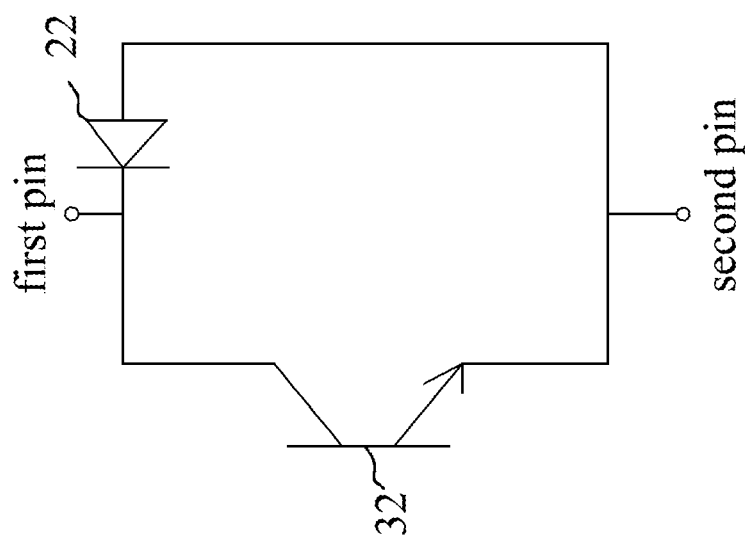
FIG. 3 is a diagram showing an equivalent circuit of FIG. 2.

Refer to FIG. 2 and FIG. 3. When the first conductivity type is an N type, the second conductivity type is a P type. Thus, the semiconductor substrate 14, the first doped well 16, and the first heavily-doped area 18 form an NPN bipolar junction transistor (BJT) 32. The NPN BJT 32 is connected with the diode 22 in parallel. The breakdown voltage of the NPN BJT 32 is adjusted by the doping concentration of the first doped well 16. One of the NPN BJT 32 and the diode 22 is triggered on when the electrostatic discharge (ESD) event occurs at the first pin or the second pin. Since the base of the NPN BJT 32 is floating and a clamping voltage highly depends on a holding voltage, the low holding voltage and the low clamping voltage of the vertical transient voltage suppression device are maintained and the ESD performance is enhanced.

Figure 4:
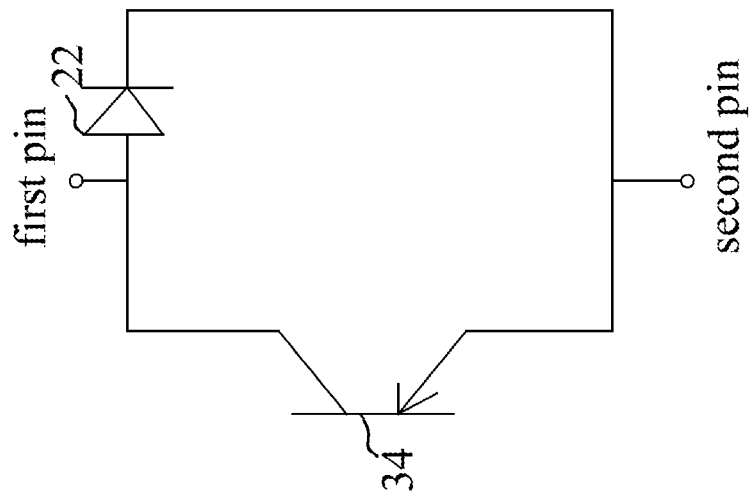
FIG. 4 is a diagram showing another equivalent circuit of FIG. 2.

Refer to FIG. 2 and FIG. 4. When the first conductivity type is a P type, the second conductivity type is an N type. Thus, the semiconductor substrate 14, the first doped well 16, and the first heavily-doped area 18 form a PNP bipolar junction transistor (BJT) 34. The PNP BJT 34 is connected with the diode 22 in parallel. The breakdown voltage of the PNP BJT 34 is adjusted by the doping concentration of the first doped well 16. One of the PNP BJT 34 and the diode 22 is triggered on when the ESD event occurs at the first pin or the second pin. Since the base of the PNP BJT 34 is floating and a clamping voltage highly depends on a holding voltage, the low holding voltage and the low clamping voltage of the vertical transient voltage suppression device are maintained and the ESD performance is enhanced.

Figure 5:
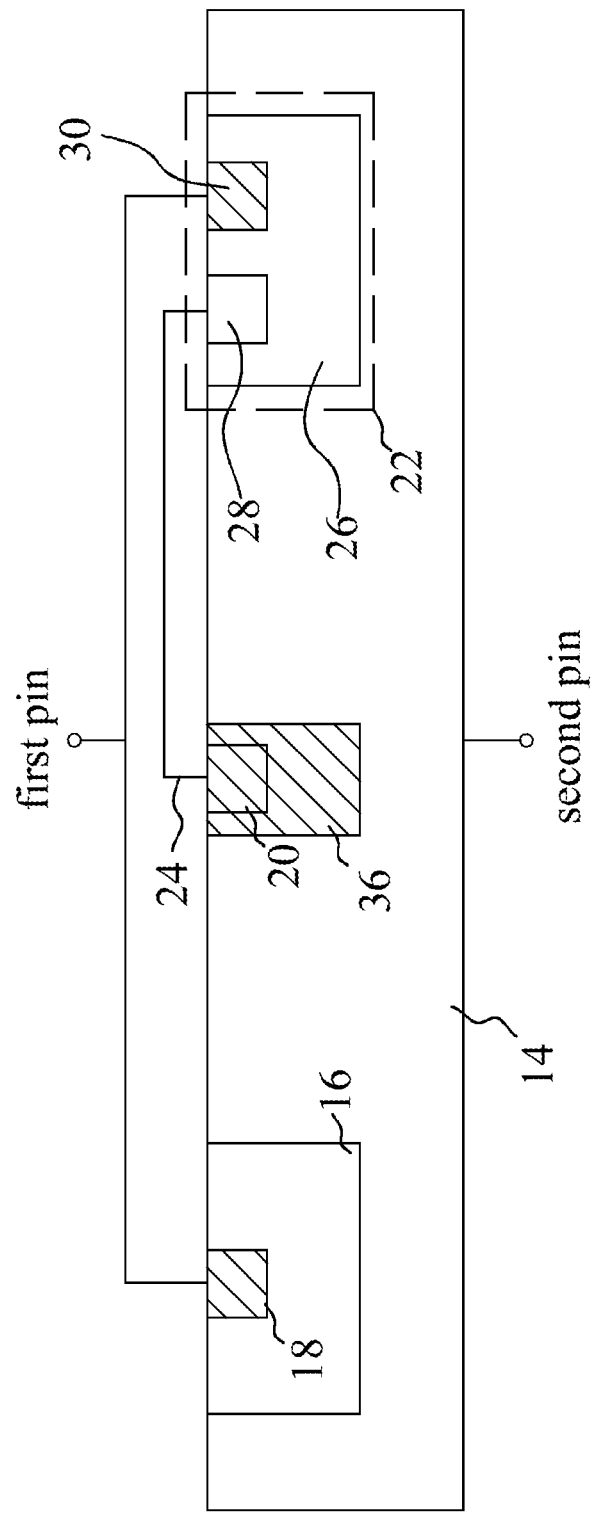
FIG. 5 is a cross-sectional view of a vertical transient voltage suppression device according to the second embodiment of the present invention.

Refer to FIG. 5. The second embodiment of a vertical transient voltage suppression device of the present invention is introduced as follows. The second embodiment is different from the first embodiment in that the second embodiment further comprises a heavily-doped well 36 having the first conductivity type. The heavily-doped well 36 is arranged in the semiconductor substrate 14, and the second heavily-doped area 20 is arranged in the heavily-doped well 36. The heavily-doped well 36 can reduce the impedance that the ESD current flows through the diode 22. The other technical features have been described previously so will not be reiterated.

Figure 6:
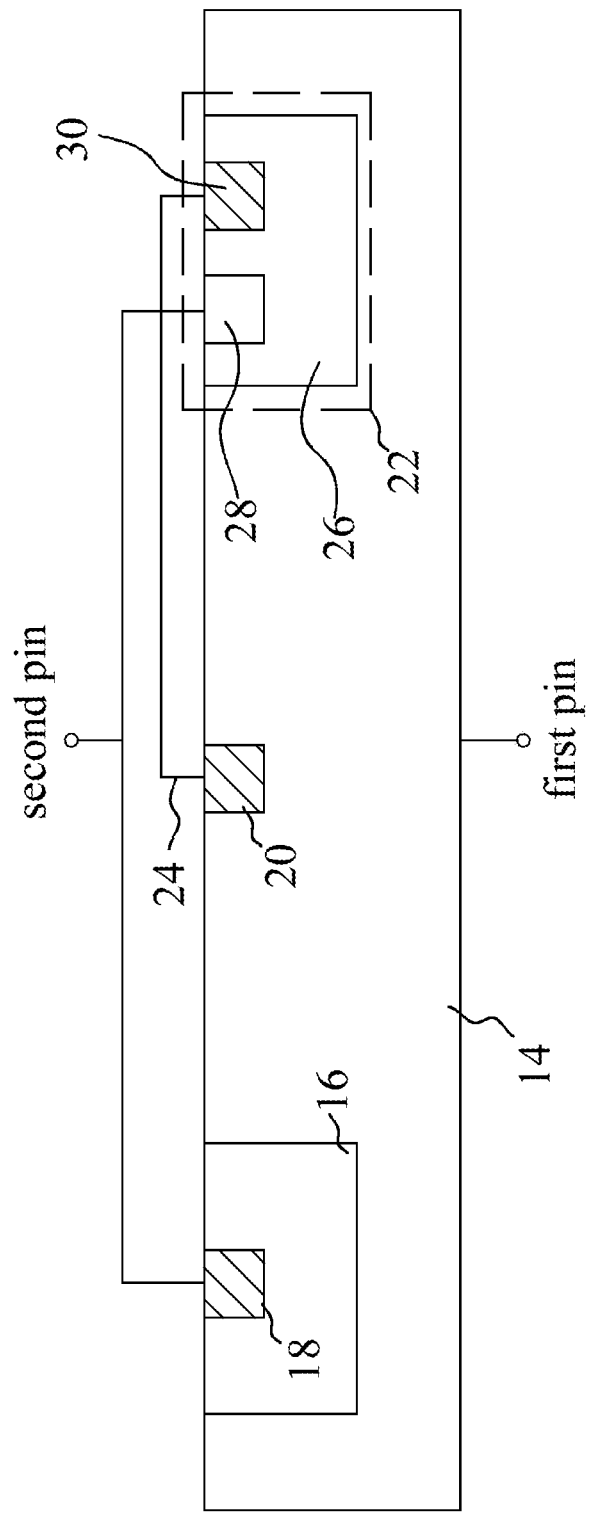
FIG. 6 is a cross-sectional view of a vertical transient voltage suppression device according to the third embodiment of the present invention.

Refer to FIG. 6. The third embodiment of a vertical transient voltage suppression device of the present invention is introduced as follows. The third embodiment is different from the first embodiment in the connection relationship of the diode 22. In the third embodiment, the fourth heavily-doped area 30 is electrically connected to the second heavily-doped area 20 through the conductive trace 24, and the semiconductor substrate 14 is electrically connected to a first pin and the first heavily-doped area 18 and the third heavily-doped area 28 are electrically connected to a second pin. The other technical features have been described previously so will not be reiterated.

Figure 7:
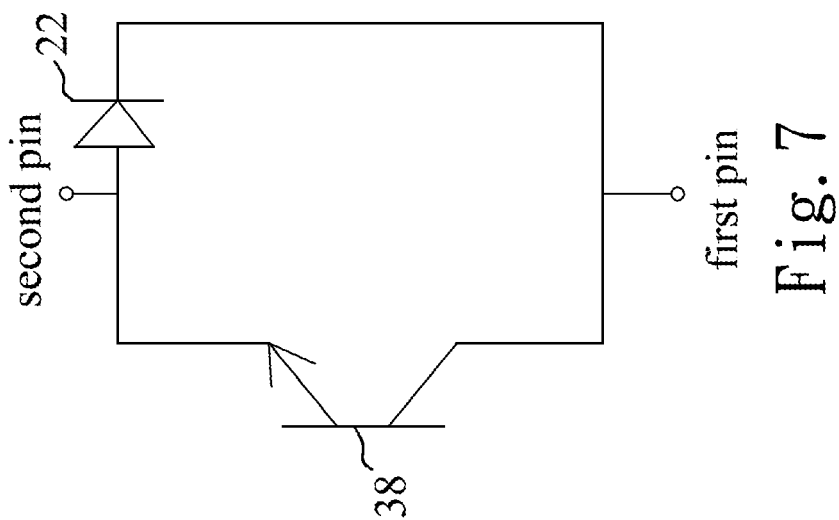
FIG. 7 is a diagram showing an equivalent circuit of FIG. 6.

Refer to FIG. 6 and FIG. 7. When the first conductivity type is an N type, the second conductivity type is a P type. Thus, the semiconductor substrate 14, the first doped well 16, and the first heavily-doped area 18 form an NPN bipolar junction transistor (BJT) 38. The NPN BJT 38 is connected with the diode 22 in parallel. The breakdown voltage of the NPN BJT 38 is adjusted by the doping concentration of the first doped well 16. One of the NPN BJT 38 and the diode 22 is triggered on when the ESD event occurs at the first pin or the second pin. Since the base of the NPN BJT 38 is floating and a clamping voltage highly depends on a holding voltage, the low holding voltage and the low clamping voltage of the vertical transient voltage suppression device are maintained and the ESD performance is enhanced.

Figure 8:
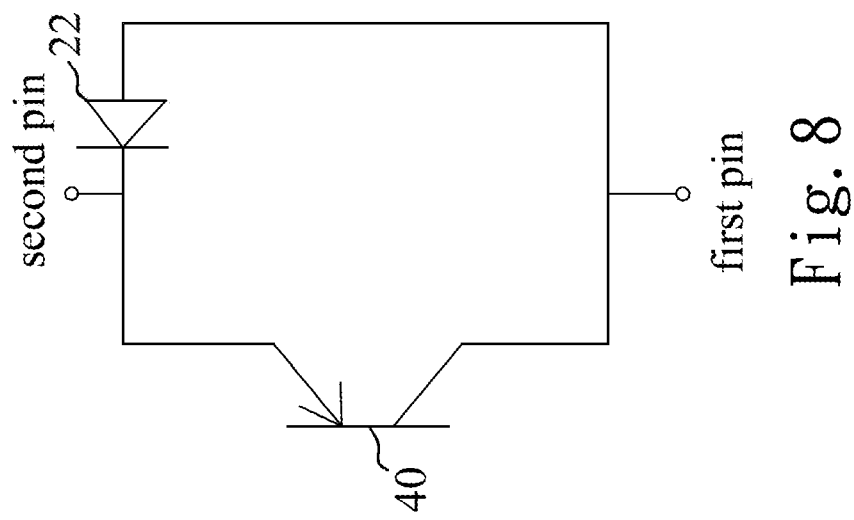
FIG. 8 is a diagram showing another equivalent circuit of FIG. 6.

Refer to FIG. 6 and FIG. 8. When the first conductivity type is a P type, the second conductivity type is an N type. Thus, the semiconductor substrate 14, the first doped well 16, and the first heavily-doped area 18 form a PNP bipolar junction transistor (BJT) 40. The PNP BJT 40 is connected with the diode 22 in parallel. The breakdown voltage of the PNP BJT 40 is adjusted by the doping concentration of the first doped well 16. One of the PNP BJT 40 and the diode 22 is triggered on when the ESD event occurs at the first pin or the second pin. Since the base of the PNP BJT 40 is floating and a clamping voltage highly depends on a holding voltage, the low holding voltage and the low clamping voltage of the vertical transient voltage suppression device are maintained and the ESD performance is enhanced.

Figure 9:
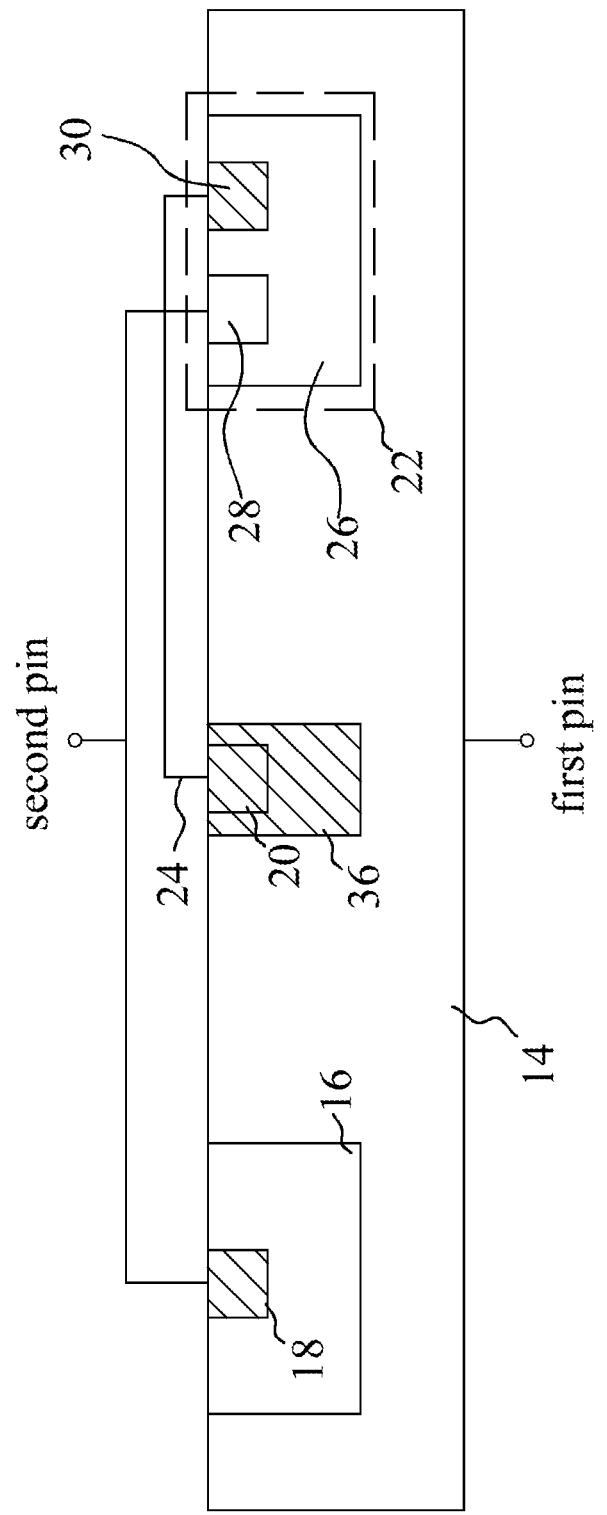
FIG. 9 is a cross-sectional view of a vertical transient voltage suppression device according to the fourth embodiment of the present invention.

Refer to FIG. 9. The fourth embodiment of a vertical transient voltage suppression device of the present invention is introduced as follows. The fourth embodiment is different from the third embodiment in that the fourth embodiment further comprises a heavily-doped well 36 having the first conductivity type. The heavily-doped well 36 is arranged in the semiconductor substrate 14, and the second heavily-doped area 20 is arranged in the heavily-doped well 36. The heavily-doped well 36 can reduce the impedance that the ESD current flows through the diode 22. The other technical features have been described previously so will not be reiterated.

Figure 10:
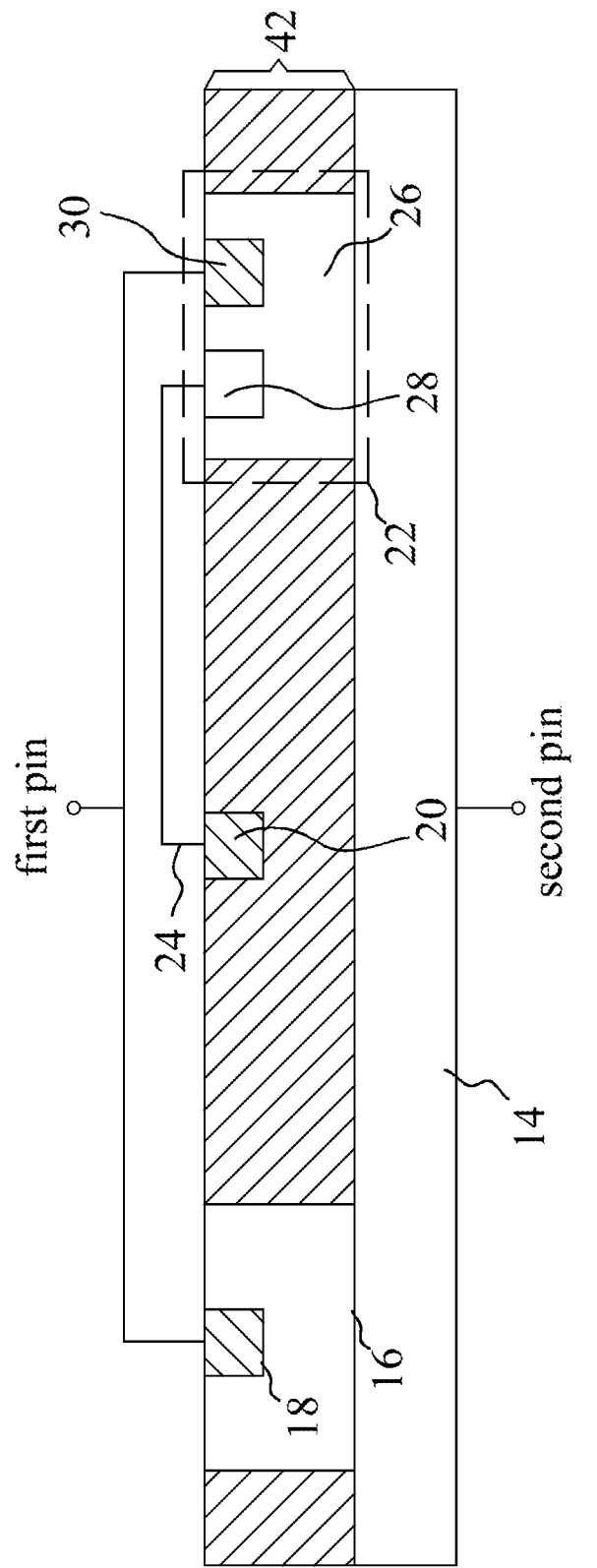
FIG. 10 is a cross-sectional view of a vertical transient voltage suppression device according to the fifth embodiment of the present invention.

Refer to FIG. 10. The fifth embodiment of a vertical transient voltage suppression device of the present invention is introduced as follows. The fifth embodiment is different from the first embodiment in that the first doped well 16, the second heavily-doped area 20, and the second doped well 26 are arranged in an epitaxial layer 42 that is arranged on the semiconductor substrate 14, wherein the first doped well 16 and the second doped well 26 contact or separate from the semiconductor substrate 14. The equivalent circuit of the fifth embodiment is the same to that of the first embodiment when the first doped well 16 and the second doped well 26 contact or separate from the semiconductor substrate 14 and the epitaxial layer 42 is N type, P type, or intrinsic. The other technical features have been described previously so will not be reiterated.

Figure 11:
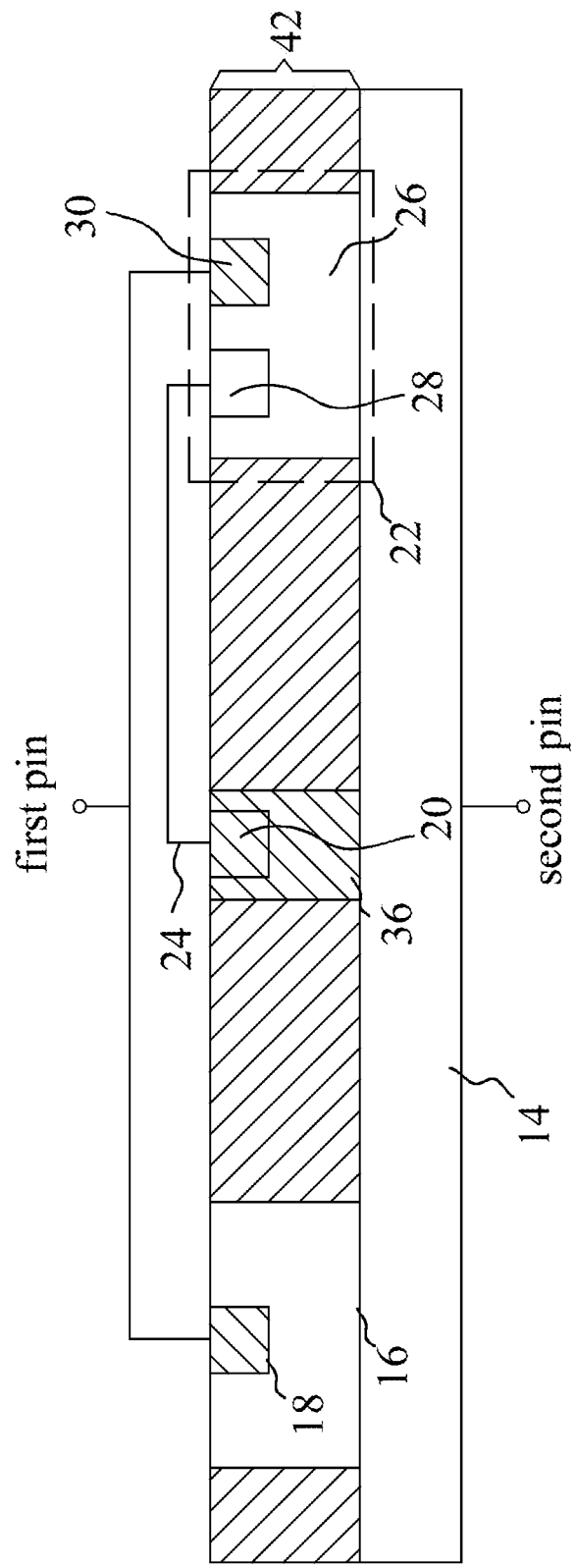
FIG. 11 is a cross-sectional view of a vertical transient voltage suppression device according to the sixth embodiment of the present invention.

Refer to FIG. 11. The sixth embodiment of a vertical transient voltage suppression device of the present invention is introduced as follows. The sixth embodiment is different from the second embodiment in that the first doped well 16, the heavily-doped well 36, and the second doped well 26 are arranged in an epitaxial layer 42 that is arranged on the semiconductor substrate 14, wherein the heavily-doped well 36 has to contact the semiconductor substrate 14. The equivalent circuit of the sixth embodiment is the same to that of the second embodiment when the first doped well 16 and the second doped well 26 contact or separate from the semiconductor substrate 14 and the epitaxial layer 42 is N type, P type, or intrinsic. The other technical features have been described previously so will not be reiterated.

Figure 12:
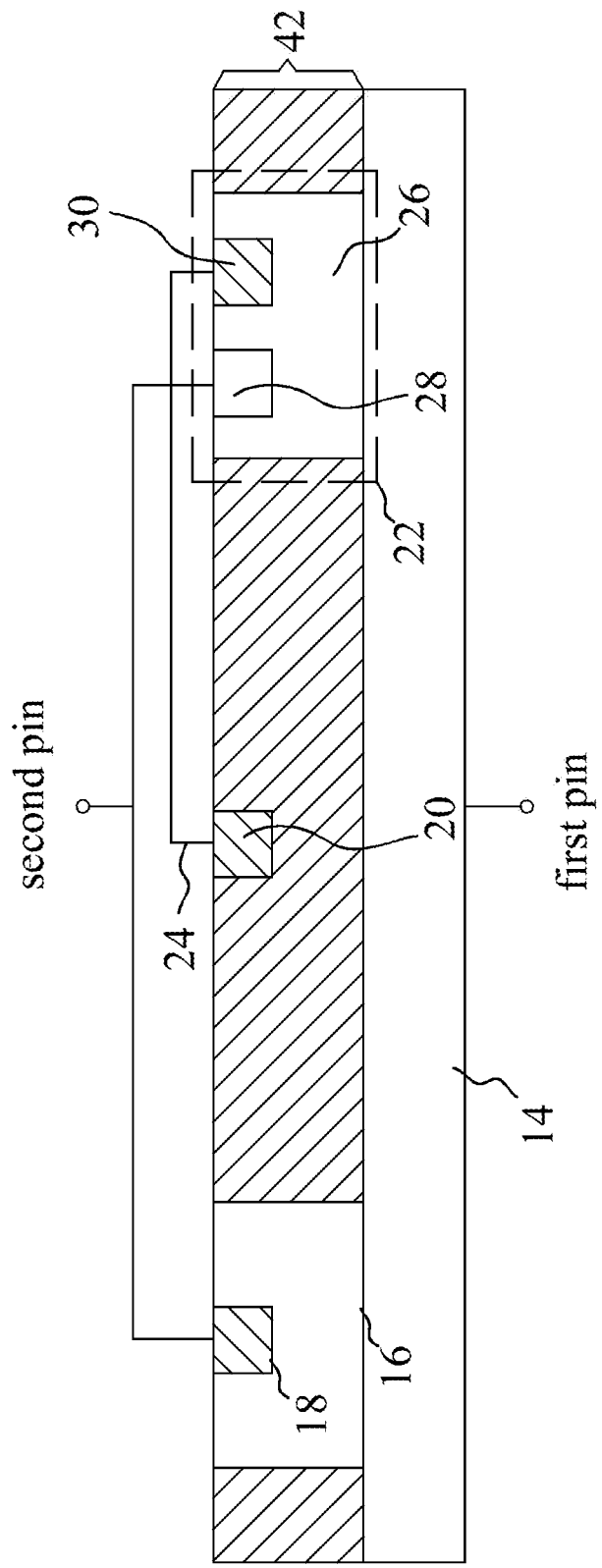
FIG. 12 is a cross-sectional view of a vertical transient voltage suppression device according to the seventh embodiment of the present invention.

Refer to FIG. 12. The seventh embodiment of a vertical transient voltage suppression device of the present invention is introduced as follows. The seventh embodiment is different from the third embodiment in that the first doped well 16, the second heavily-doped area 20, and the second doped well 26 are arranged in an epitaxial layer 42 that is arranged on the semiconductor substrate 14, wherein the first doped well 16 and the second doped well 26 contact or separate from the semiconductor substrate 14. The equivalent circuit of the seventh embodiment is the same to that of the third embodiment when the first doped well 16 and the second doped well 26 contact or separate from the semiconductor substrate 14 and the epitaxial layer 42 is N type, P type, or intrinsic. The other technical features have been described previously so will not be reiterated.

Figure 13:
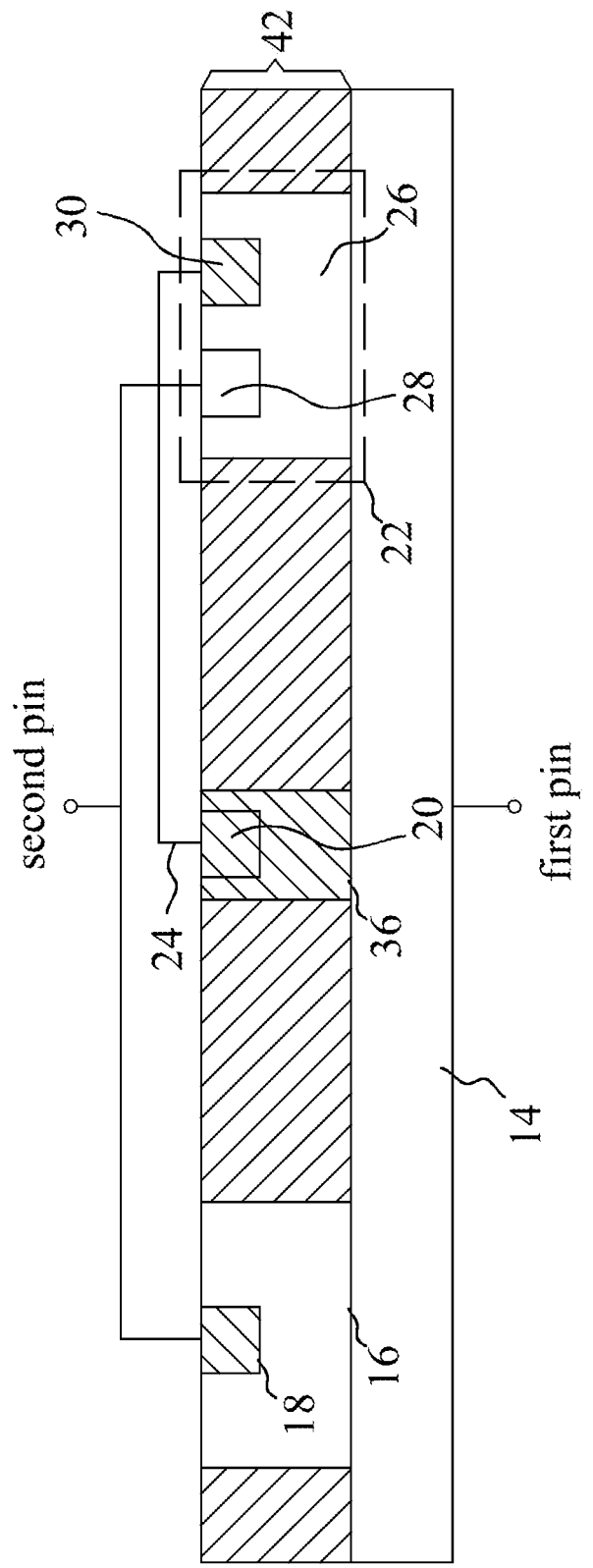
FIG. 13 is a cross-sectional view of a vertical transient voltage suppression device according to the eighth embodiment of the present invention.

Refer to FIG. 13. The eighth embodiment of a vertical transient voltage suppression device of the present invention is introduced as follows. The eighth embodiment is different from the fourth embodiment in that the first doped well 16, the heavily-doped well 36, and the second doped well 26 are arranged in an epitaxial layer 42 that is arranged on the semiconductor substrate 14, wherein the heavily-doped well 36 has to contact the semiconductor substrate 14. The equivalent circuit of the eighth embodiment is the same to that of the fourth embodiment when the first doped well 16 and the second doped well 26 contact or separate from the semiconductor substrate 14 and the epitaxial layer 42 is N type, P type, or intrinsic. The other technical features have been described previously so will not be reiterated.

In conclusion, the present invention floats the base of the vertical BJT to maintain a low holding voltage and a low clamping voltage and enhance the ESD performance.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A vertical transient voltage suppression device comprising:

a semiconductor substrate having a first conductivity type;
a first doped well having a second conductivity type, arranged in the semiconductor substrate, and spaced from a bottom of the semiconductor substrate, and the first doped well is floating;
a first heavily-doped area having the first conductivity type and arranged in the first doped well;
a second heavily-doped area having the first conductivity type and arranged in the semiconductor substrate; and
a diode arranged in the semiconductor substrate and electrically connected to the second heavily-doped area through a conductive trace, wherein the diode and the first heavily-doped area are electrically connected to a pin;
wherein the semiconductor substrate, the first doped well, and the first heavily-doped area form a bipolar junction transistor, the bipolar junction transistor or the diode is triggered on when an electrostatic discharge (ESD) voltage is applied across the pin and the semiconductor substrate.

2. The vertical transient voltage suppression device according to claim 1, wherein the first conductivity type is a P type and the second conductivity type is an N type.

3. The vertical transient voltage suppression device according to claim 1, wherein the first conductivity type is an N type and the second conductivity type is a P type.

4. The vertical transient voltage suppression device according to claim 1, wherein the diode further comprises:
a second doped well having the second conductivity type and arranged in the semiconductor substrate;
a third heavily-doped area having the second conductivity type and arranged in the second doped well, and the third heavily-doped area is electrically connected to the second heavily-doped area through the conductive trace; and
a fourth heavily-doped area having the first conductivity type and arranged in the second doped well.

5. The vertical transient voltage suppression device according to claim 4, wherein the pin is a first pin, the first heavily-doped area and the fourth heavily-doped area are electrically connected to the first pin and the semiconductor substrate is electrically connected to a second pin.

6. The vertical transient voltage suppression device according to claim 1, wherein the diode further comprises:
a second doped well having the second conductivity type and arranged in the semiconductor substrate;
a third heavily-doped area having the second conductivity type and arranged in the second doped well; and
a fourth heavily-doped area having the first conductivity type and arranged in the second doped well, and the fourth heavily-doped area is electrically connected to the second heavily-doped area through the conductive trace.

7. The vertical transient voltage suppression device according to claim 6, wherein the pin is a second pin, the semiconductor substrate is electrically connected to a first pin and the first heavily-doped area and the third heavily-doped area are electrically connected to the second pin.

8. The vertical transient voltage suppression device according to claim 1, further comprising a heavily-doped well having the first conductivity type, the heavily-doped well is arranged in the semiconductor substrate, and the second heavily-doped area is arranged in the heavily-doped well.

9. A vertical transient voltage suppression device comprising:
a semiconductor substrate having a first conductivity type;
an epitaxial layer arranged on the semiconductor substrate;
a first doped well having a second conductivity type and arranged in the epitaxial layer, and the first doped well is floating;
a first heavily-doped area having the first conductivity type and arranged in the first doped well;
a second heavily-doped area having the first conductivity type and arranged in the epitaxial layer; and
a diode arranged in the epitaxial layer and electrically connected to the second heavily-doped area through a conductive trace, wherein the diode and the first heavily-doped area are electrically connected to a pin;
wherein the semiconductor substrate, the first doped well, and the first heavily-doped area form a bipolar junction transistor, the bipolar junction transistor or the diode is triggered on when an electrostatic discharge (ESD) voltage is applied across the pin and the semiconductor substrate.

10. The vertical transient voltage suppression device according to claim 9, wherein the first conductivity type is a P type and the second conductivity type is an N type.

11. The vertical transient voltage suppression device according to claim 9, wherein the first conductivity type is an N type and the second conductivity type is a P type.

12. The vertical transient voltage suppression device according to claim 9, wherein the diode further comprises:
a second doped well having the second conductivity type and arranged in the epitaxial layer;
a third heavily-doped area having the second conductivity type and arranged in the second doped well, and the third heavily-doped area is electrically connected to the second heavily-doped area through the conductive trace; and
a fourth heavily-doped area having the first conductivity type and arranged in the second doped well.

13. The vertical transient voltage suppression device according to claim 12, wherein the pin is a first pin, the first heavily-doped area and the fourth heavily-doped area are electrically connected to the first pin and the semiconductor substrate is electrically connected to a second pin.

14. The vertical transient voltage suppression device according to claim 9, wherein the diode further comprises:
a second doped well having the second conductivity type and arranged in the epitaxial layer;
a third heavily-doped area having the second conductivity type and arranged in the second doped well; and
a fourth heavily-doped area having the first conductivity type and arranged in the second doped well, and the fourth heavily-doped area is electrically connected to the second heavily-doped area through the conductive trace.

15. The vertical transient voltage suppression device according to claim 14, wherein the pin is a second pin, the semiconductor substrate is electrically connected to a first pin and the first heavily-doped area and the third heavily-doped area are electrically connected to the second pin.

16. The vertical transient voltage suppression device according to claim 9, further comprising a heavily-doped well having the first conductivity type, the heavily-doped well is arranged in the epitaxial layer to contact the semiconductor substrate, and the second heavily-doped area is arranged in the heavily-doped well.

* * * * *